United States Patent
Chen et al.

(10) Patent No.: US 11,508,933 B2
(45) Date of Patent: Nov. 22, 2022

(54) DISPLAY PANEL AND DISPLAY DEVICE

(71) Applicants: Hefei BOE Display Technology Co., Ltd., Hefei (CN); BOE Technology Group Co., Ltd., Beijing (CN)

(72) Inventors: Jie Chen, Beijing (CN); Jiewei Li, Beijing (CN); Mengyu Luan, Beijing (CN)

(73) Assignees: HEFEI BOE DISPLAY TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 192 days.

(21) Appl. No.: 16/465,951

(22) PCT Filed: Oct. 29, 2018

(86) PCT No.: PCT/CN2018/112423
§ 371 (c)(1),
(2) Date: May 31, 2019

(87) PCT Pub. No.: WO2019/200884
PCT Pub. Date: Oct. 24, 2019

(65) Prior Publication Data
US 2021/0104700 A1     Apr. 8, 2021

(30) Foreign Application Priority Data
Apr. 20, 2018  (CN) .......................... 201810360873.1

(51) Int. Cl.
*H01L 51/52* (2006.01)
*H01L 51/56* (2006.01)
*H01L 27/32* (2006.01)

(52) U.S. Cl.
CPC ...... *H01L 51/5246* (2013.01); *H01L 51/5253* (2013.01); *H01L 51/56* (2013.01); *H01L 27/3246* (2013.01); *H01L 27/3258* (2013.01)

(58) Field of Classification Search
CPC . H01L 51/5246; H01L 51/5253; H01L 51/56; H01L 27/3246; H01L 27/3258;
(Continued)

(56) References Cited

U.S. PATENT DOCUMENTS 9,472,786 B2 * 10/2016 Ahn ..................... H01L 51/5203
9,865,842 B2 *  1/2018 Song .................... H01L 51/525
(Continued)

FOREIGN PATENT DOCUMENTS

CN         1433067 A    7/2003
CN       102447077 A    5/2012
(Continued)

OTHER PUBLICATIONS

International Search Report and English Translation of Box V of the Written Opinion dated Jan. 30, 2019, received for corresponding PCT Application No. PCT/CN2018/112423.

*Primary Examiner* — Shouxiang Hu
(74) *Attorney, Agent, or Firm* — Kinney & Lange, P.A.

(57) ABSTRACT

A display panel, a method for manufacturing the same, and a display device are provided. The display panel includes a first substrate and a second substrate opposite to each other; a display structure on a side of the first substrate facing the second substrate; a sealant surrounding the display structure; and a barrier structure surrounding the display structure and located between the display structure and the sealant, the barrier structure being disposed on one of the first substrate or the second substrate and being spaced apart from the other of the first substrate or the second substrate.

8 Claims, 4 Drawing Sheets

(58) Field of Classification Search
CPC . H01L 51/525; H01L 51/524; H01L 51/5259; H01L 27/3244; H01L 27/156; H01L 51/5237; H01L 51/52; H01L 27/32; H01L 27/3251; H01L 27/3283; H01L 51/5243
See application file for complete search history.

(56) References Cited

U.S. PATENT DOCUMENTS

| | | | |
|---|---|---|---|
| 10,782,569 B2* | 9/2020 | Hu | G02F 1/13394 |
| 2007/0159094 A1* | 7/2007 | Oh | H01L 27/3246 |
| | | | 313/512 |
| 2017/0012243 A1* | 1/2017 | Suzuki | H01L 51/5259 |
| 2018/0190938 A1 | 7/2018 | Wang et al. | |

FOREIGN PATENT DOCUMENTS

| | | |
|---|---|---|
| CN | 103579294 A | 2/2014 |
| CN | 103792734 A | 5/2014 |
| CN | 106784376 A | 5/2017 |
| CN | 108598277 A | 9/2018 |

\* cited by examiner

DISPLAY PANEL AND DISPLAY DEVICE

CROSS-REFERENCE TO RELATED APPLICATION

The present application is the national phase of PCT Application No. PCT/CN2018/112423 filed on Oct. 29, 2018, which in turn claims the benefit of Chinese Patent Application No. 201810360873.1 filed on Apr. 20, 2018 in the State Intellectual Property Office of China, the whole disclosure of which is incorporated herein by reference.

TECHNICAL FIELD

The present disclosure relates to the field of display technologies, and in particular, to a display panel, a method for manufacturing the same, and a display device.

BACKGROUND

In the OLED encapsulation technology of the related art, the glass encapsulation has a relatively broad application space due to its relatively simple encapsulation process, relatively low encapsulation cost, and relatively mature technology. Especially in large-scale top-emitting structures, lighting applications and double-sided displays, glass encapsulation is one of the most cost-effective encapsulation methods. However, in a condition that the display panel is encapsulated in glass, foreign matters such as moisture may penetrate inside the display panel through the sealant.

SUMMARY

According to an aspect of the present disclosure, there is provided a display panel comprising:

a first substrate and a second substrate opposite to each other;

a display structure on a side of the first substrate facing towards the second substrate;

a sealant surrounding the display structure; and a barrier structure surrounding the display structure and located between the display structure and the sealant, the barrier structure being disposed on one of the first substrate or the second substrate and being spaced apart from the other of the first substrate or the second substrate.

In an embodiment, the barrier structure extends from the first substrate toward the second substrate and is spaced apart from the second substrate by a first preset distance.

In an embodiment, the display panel further comprises: an encapsulation layer encasing the display structure and the barrier structure.

In an embodiment, the barrier structure has a height greater than a height of the display structure, and the barrier structure comprises a first ramp located on a side of the barrier structure facing towards the display structure and extending from a top of the barrier structure toward a top of the display structure, the first ramp and a plane in which the first substrate is located form an acute angle which is greater than 0° and less than 45°.

In an embodiment, the barrier structure comprises a second ramp on a side of the barrier structure facing towards the sealant, and the second ramp plane and a planes in which the first substrates is located form an acute angle which is greater than 45° and less than 90°.

In an embodiment, the display structure further comprises at least one of a planarization layer and a pixel defining layer, and the barrier structure is formed in a same layer with one of the planarization layer and the pixel defining layer.

In an embodiment, the barrier structure extends from the second substrate toward the first substrate and is spaced apart from the first substrate by a second preset distance.

In an embodiment, the display panel further comprises: an encapsulation layer encasing the display structure.

In an embodiment, the barrier structure is made of a material comprising a frit.

In an embodiment, there is a distance of 10 μm to 50 μm between the first substrate and the second substrate, and there is a difference of 1 μm to 10 μm between the distance and the height of the barrier structure.

In an embodiment, the display panel further comprises: a filling structure filled in a space surrounded by the first substrate, the second substrate, and the sealant.

In an embodiment, the display structure comprises a first electrode layer, a second electrode layer, and a light-emitting functional layer between the first electrode layer and the second electrode layer.

According to another aspect of the present disclosure, there is provided a display device comprising the display panel mentioned above.

According to yet another aspect of the present disclosure, there is provided a method for manufacturing a display panel, comprising:

forming a display structure as well as a barrier structure surrounding the display structure on a first substrate;

forming a sealant on a second substrate or the first substrate;

assembling the first substrate and the second substrate and configuring the sealant to surround the barrier structure.

In an embodiment, the display structure further comprises at least one of a planarization layer and a pixel defining layer, and forming the barrier structure together with one of the planarization layer and the pixel defining layer in a same material and by a same patterning process.

In an embodiment, the method further comprises:

forming an encapsulation layer encasing the display structure and the barrier structure on the first substrate on which the display structure and the barrier structure are formed.

According to yet another aspect of the present disclosure, the method for manufacturing a display panel, comprising:

forming a display structure on the first substrate;

forming a barrier structure on the second substrate;

forming a sealant on the second substrate or the first substrate;

assembling the first substrate and the second substrate, and configuring the barrier structure to surround the display structure, and the sealant to surround the barrier structure.

In an embodiment, the method further comprises:

forming an encapsulation layer encasing the display structure on the first substrate on which the display structure is formed.

In an embodiment, the method further comprises: before the step of assembling the first substrate and the second substrate;

forming a filling adhesive on the first substrate or the second substrate.

DETAILED DESCRIPTION OF EMBODIMENTS

In order to enable those skilled in the art to better understand the technical solutions of the present disclosure, the display panel and the method for manufacturing the same and the display device provided by the present disclosure will be described in detail below with reference to the accompanying drawings.

In a condition that the display panel is encapsulated in glass, moisture may penetrate inside the display panel through the sealant. In order to obtain better encapsulation performance, a cell gap of the display panel is usually designed to be small, and a cross-sectional area of an outer boundary of the sealant is reduced, thereby reducing the size of the moisture permeation cross section.

A backing plate in the display panel needs to pass through multiple chambers such as array, evaporation and encapsulation before it enters a bonding chamber, especially upon preparing a laminated white OLED display structure, the more chambers the backing plate passes through, the longer the path of the backing plate is. During a passage of the backing plate along these paths, a few of foreign matters enters the OLED display structure or a surface of the OLED display structure. When the backing plate is bonded to a cover glass in the bonding chamber, since the cell gap of the display panel is too small, the foreign matters are subjected to an action of a pressure, and the foreign matters may press and damage the encapsulation layer covering the display structure, thereby forming a path for moisture permeation, and causing the display device to fail. On the other hand, the foreign matters may also press and damage the OLED display structure or the TFT, thereby resulting in abnormalities such as dark spots and the like, and seriously hindering an improvement to product quality.

The present disclosure provides a display panel and a method for manufacturing the same that enable the display panel to have a small moisture permeation cross section while increasing the tolerance of the display panel to the foreign matters.

Figure 1:
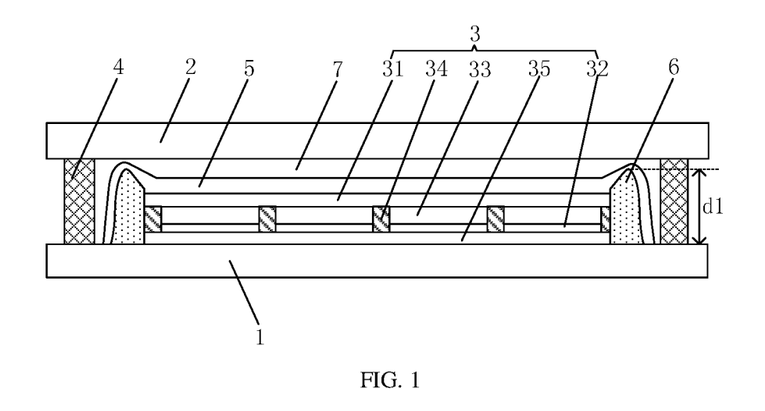
FIG. 1 is a schematic structural view of a display panel according to an embodiment of the present disclosure.
Figure 2:
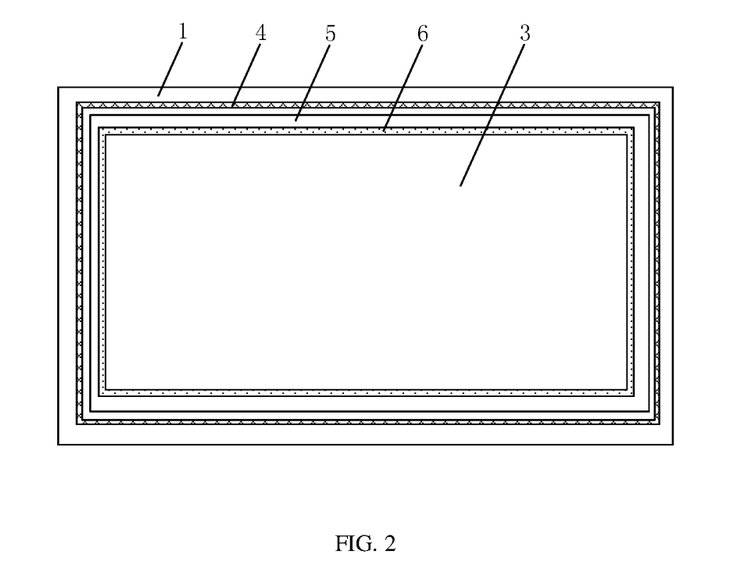
FIG. 2 is a top view of the display panel in FIG. 1.

An embodiment of the present disclosure provides a display panel. FIG. 1 is a schematic structural view of a display panel according to an embodiment of the present disclosure, and FIG. 2 is a top view of the display panel of FIG. 1. As shown in FIG. 1 and FIG. 2, the display panel includes: a first substrate 1 and a second substrate 2 disposed opposite to each other. A display structure 3 and a sealant 4 are disposed between the first substrate 1 and the second substrate 2. The sealant 4 is located on the periphery of the display structure 3 and surrounds the display structure 3. A barrier structure 6 is disposed between the sealant 4 and the display structure 3, and the display structure 3 together with the barrier structure 6 are covered with an encapsulation layer 5. Specifically, the display structure 3 is disposed on a side of the first substrate 1 facing towards the second substrate 2, and the barrier structure 6 is disposed around the display structure 3 and is located between the display structure 3 and the sealant 4. The barrier structure 6 is disposed on one of the first substrate 1 or the second substrate 2 and is spaced apart from the other of the first substrate 1 or the second substrate 2.

It should be noted that the second substrate 2 is not shown in FIG. 2 in order to clearly illustrate a planar positional relationship among respective structures. The second substrate 2 is a cover plate, e.g., a glass cover plate.

In this embodiment, as shown in FIGS. 1 and 2, the display structure 3 is located in a display area, and the display structure 3 includes a first electrode layer 31, a second electrode layer 32, and a light-emitting functional layer 33 located between the first electrode layer 31 and the second electrode layer 32. The first electrode layer 31, the light-emitting functional layer 33, and the second electrode layer 32 are arranged to be close to the first substrate 1 sequentially. The display panel is, for example, an OLED display panel. In one embodiment, the first electrode layer 31 is a cathode layer, the second electrode layer 32 is an anode layer, and the light-emitting functional layer 33 may include an electron injection layer, an electron transport layer, an electroluminescence layer, a hole transport layer, and a hole injection layer which are arranged to be close to the first substrate 1 sequentially. The electron injection layer is disposed adjacent to the first electrode layer 31, and the hole injection layer is disposed adjacent to the second electrode layer 32. The first electrode layer 31, the second electrode layer 32, and the light emitting functional layer 33 in the display structure 3 may form a plurality of OLED display devices. In other words, the display structure 3 may include a plurality of OLED display devices. In this embodiment, the OLED display device is a white light OLED display device. In this embodiment, the display structure 3 further includes a thin film transistor, a color resist, a planarization (abbreviated as PLN) layer 35, and a pixel define layer (abbreviated as PDL) 34 disposed on the first substrate 1. The planarization layer is located on the thin film transistor and the color resist, and the second electrode layer 32 is located on the planarization layer 35. The pixel defining layer 34 is divided into a plurality of pixel defining layers 34, and the light emitting functional layer 33 and the second electrode layer 32 are stacked between adjacent pixel defining layers 34. In an embodiment, the color resistance may include a red color resist, a green color resist, or a blue color resist. The red color resist, the green color resist, and the blue color resistance are sequentially arranged.

In an embodiment, as shown in FIGS. 1 and 2, the barrier structure 6 is located on the first substrate 1, extends from the first substrate 1 toward the second substrate 2, and is spaced apart from the second substrate 2 by a first preset distance. The encapsulation layer 5 also encases the barrier structure 6, and the barrier structure 6 is disposed to be abutted the display structure 3. The encapsulation layer 5 encases the display structure 3 and the barrier structure 6. Specifically, the encapsulation layer 5 encases the sidewall of the barrier structure 6 close to the sealant 4 so as to completely encase the barrier structure 6 and the display structure 3.

A height d1 of the barrier structure 6 can be determined depending on the cell gap of the display panel. In a condition that a difference between the cell gap of the display panel and the height of the barrier structure 6 is too large, it may result in that the moisture permeation cross section may accordingly be large; in a condition that the difference between the cell gap of the display panel and the height of the barrier structure 6 is too small, it may result in that the encapsulation layer 5 is pressed and damaged by the second substrate 2 when being assembled. Therefore, in the present embodiment, the difference between the cell gap of the display panel and the height of the barrier structure 6 is 1 μm to 10 μm, on the one hand, the moisture permeation cross section is prevented from being increased, and on the other hand, the encapsulation layer 5 is prevented from being pressed and damaged by the substrate 2.

A material of the barrier structure 6 may be the same as the material of the planarization layer, and then the barrier structure 6 may be disposed in a same layer as the planarization layer 35; or the material of the barrier structure 6 may be the same as the material of the pixel defining layer, and then the barrier structure 6 may be disposed in a same layer as the pixel defining layer 34; alternatively, the material of the barrier structure 6 may be a polymer material, in which case the barrier structure 6 may be formed separately. Here, forming in a same layer means that forming with a same material by a same patterning process.

Figure 3:
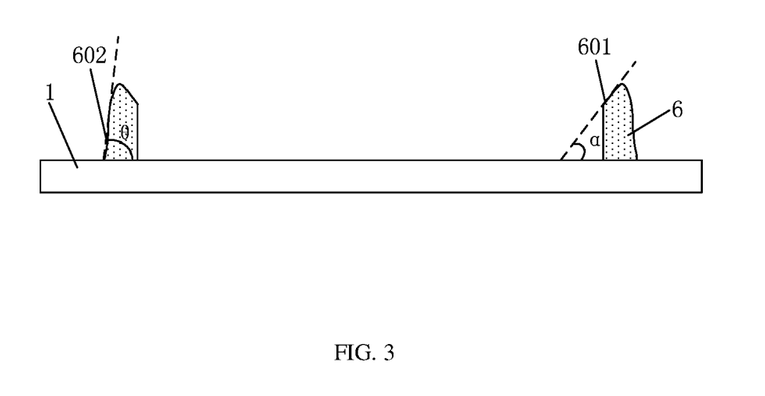
FIG. 3 is a schematic structural view of a barrier structure in FIG. 1.

FIG. 3 is a schematic structural view of the barrier structure in FIG. 1, which only illustrates the first substrate 1 and the barrier structure 6. As shown in FIGS. 1 and 3, the height of the barrier structure 6 is greater than the height of the display structure 3, and a first ramp 601 is formed on a side of the barrier structure 6 facing towards the display structure 3 and extends from a top of the barrier structure 6 toward a top of the display structure 3. The first ramp 601 and the plane in which the first substrate 1 is located form an acute angle α greater than 0° and less than 45°, thereby ensuring that the encapsulation layer 5 located on the first ramp 601 will not subject to a too much stress at a transition position between the display structure 3 and the barrier structure 6.

As shown in FIG. 1 and FIG. 3, a second ramp 602 is formed on a side of the barrier structure 6 facing toward the sealant 4, and the second ramp 602 and the plane in which the first substrate 1 is located form an acute angle θ greater than 45° and less than 90°. Thereby, it is ensured that the barrier structure 6 occupies the edge of the display panel as little as possible, which is beneficial to realize a narrow bezel of the display panel.

It should be noted that the display structure 3 is not shown in FIG. 3 in order to clearly illustrate various angles of the barrier structure 6.

In an embodiment, the encapsulation layer 5 may be a Thin Film Encapsulation (abbreviated as TFE) layer.

The encapsulation layer 5 may be a single layer structure. In this case, the material of the encapsulation layer 5 may be an inorganic material. For example, the material of the encapsulation layer 5 may include one or any combination of SiNx, SiOx, SiCx, SiOxNy, SiCxNy, or AlOx.

The encapsulating layer 5 may further include a plurality of inorganic layers and a plurality of organic layers, both of which are alternately disposed. In this case, the material of the organic layer may be an epoxy resin material or an acrylic resin material; and the material of the inorganic layer may include one or any combination of SiNx, SiOx, SiCx, SiOxNy, SiCxNy or AlOx.

In an embodiment, the sealant 4 has a height of 10 μm to 50 μm, which is equivalent to a distance between the first substrate and the second substrate. The height of the sealant 4 is the cell gap of the display panel. With the above height, the risk of the foreign matters pressing and damaging the film layer can be significantly reduced.

In addition, the display panel provided by the embodiments of the present disclosure further includes: a filling structure 7. The filling structure 7 is filled between the first substrate 1 and the second substrate 2, and the filling structure 7 is surrounded by the frame sealant 4, for example, the filling structure is filled in a space surrounded by the first substrate, the second substrate and the sealant. As shown in FIG. 1, in the present embodiment, the filling structure 7 covers the encapsulation layer 5 and is filled between the encapsulation layer 5 and the sealant 4. In an embodiment, the material of the filling structure 7 is a filling adhesive.

In an embodiment, a moisture permeation region is formed between a top end of the barrier structure 6 and the second substrate 2, and the moisture permeation region has a cross section functioning as the moisture permeation cross section. As can be seen from FIG. 1, since the barrier structure 6 is provided, a size of the moisture permeation cross section is reduced. In this embodiment, by adjusting the height of the barrier structure 6, the distance between the top end of the barrier structure 6 and the second substrate 2 can be adjusted, so that a purpose of reducing the size of the moisture permeation cross section can be achieved by regulation. In the meantime, since the present embodiment is aimed to reduce the moisture permeation cross section by adding the barrier structure 6, it is not necessary to reduce the cell gap of the display panel, so that the display panel can maintain a relatively large cell gap, thereby enhancing the tolerance of the display panel to the foreign matters and reducing the risk of foreign matters pressing and damaging the film layer. In practical applications, if it is necessary to increase the cell gap of the display panel, the height of the barrier structure 6 can be increased correspondingly, thereby achieving the purpose of reducing the size of the moisture permeation cross section and reducing the risk of the foreign matters pressing and damaging the film layer.

As described above, in the technical solution of the display panel provided by the above embodiments, a barrier structure is disposed between the sealant and the display structure, and the barrier structure reduces the size of the moisture permeation cross section, thereby enhancing the ability of the display panel being separated from the moisture. Moreover, it is not necessary to reduce the cell gap of the display panel, thereby enhancing the tolerance of the display panel to foreign matters, and significantly reducing the risk of the foreign matters pressing and damaging the film layer.

Figure 4:
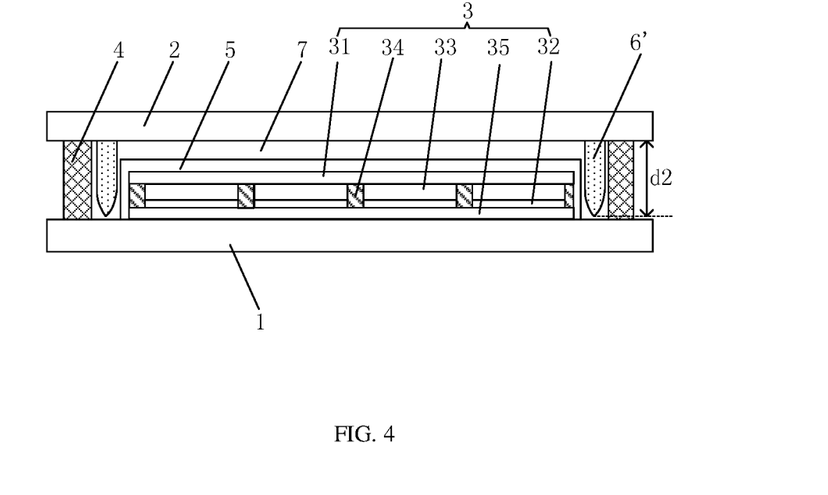
FIG. 4 is a schematic structural view of a display panel according to an embodiment of the present disclosure.
Figure 5:
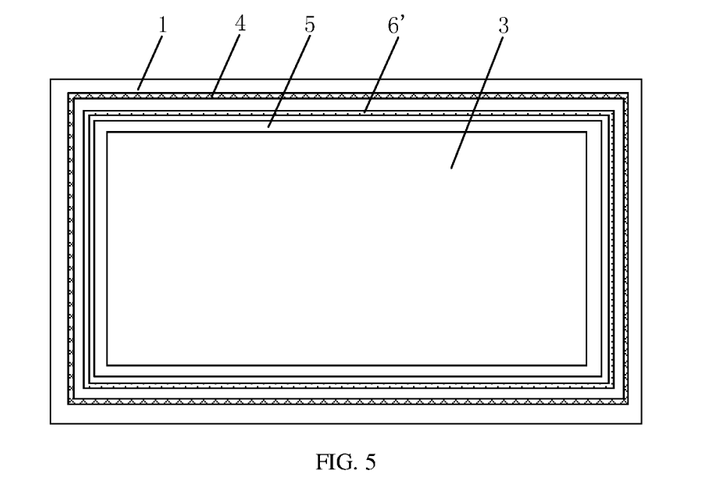
FIG. 5 is a top view of the display panel in FIG. 4.

An embodiment of the present disclosure provides a display panel, FIG. 4 is a schematic structural view of a display panel according to an embodiment of the present disclosure, and FIG. 5 is a top view of the display panel of FIG. 4. As shown in FIG. 4 and FIG. 5, the display panel includes: a first substrate 1 and a second substrate 2 disposed opposite to each other. A display structure 3 and a sealant 4 are disposed between the first substrate 1 and the second substrate 2. The sealant 4 is located on the periphery of the display structure 3 and surrounds the display structure 3. The display structure 3 is encased by an encapsulation layer 5, and a barrier structure 6' is disposed between the sealant 4 and the display structure 3. Specifically, the display structure 3 is disposed on a side of the first substrate 1 facing towards the second substrate 2, and the barrier structure 6' is disposed around the display structure 3 and located between the display structure 3 and the sealant 4.

It should be noted that the second substrate 2 is not shown in FIG. 5 in order to clearly illustrate the planar positional relationship among various structures. The second substrate 2 is a cover plate, e.g., a glass cover plate.

In this embodiment, as shown in FIGS. 4 and 5, the display structure 3 is located in the display area, and the display structure 3 includes a first electrode layer 31, a second electrode layer 32, and a light-emitting functional layer 33 located between the first electrode layer 31 and the second electrode layer 32. The first electrode layer 31, the light-emitting functional layer 33, and the second electrode layer 32 are arranged to be close to the first substrate 1 sequentially. The display panel is, for example, an OLED display panel. In one embodiment, the first electrode layer 31 is a cathode layer, the second electrode layer 32 is an anode layer, and the light-emitting functional layer 33 may include an electron injection layer, an electron transport layer, an electroluminescence layer, a hole transport layer, and a hole injection layer which are arranged to be close to the first substrate 1 sequentially. The electron injection layer is disposed adjacent to the first electrode layer 31, and the hole injection layer is disposed adjacent to the second electrode layer 32. The first electrode layer 31, the second electrode layer 32, and the light emitting functional layer 33 in the display structure 3 may form a plurality of OLED display devices. In other words, the display structure 3 may include a plurality of OLED display devices. In this embodiment, the OLED display device is a white light OLED display device. In this embodiment, the display structure 3 further includes a thin film transistor, a color resist, a planarization (abbreviated as PLN) layer 35, and a pixel define layer (abbreviated as PDL) 34 disposed on the first substrate 1. The planarization layer is located on the thin film transistor and the color resist is located on the planarization layer 35, and the second electrode layer 32 is located on the color resist. The pixel defining layer 34 is divided into a plurality of pixel defining layers 34, and the light emitting functional layer 33 and the second electrode layer 32 are stacked between adjacent pixel defining layers 34. In an embodiment, the color resistance may include a red color resist, a green color resist, or a blue color resist. The red color resist, the green color resist, and the blue color resistance are sequentially arranged.

In an embodiment, as shown in FIGS. 4 and 5, the barrier structure 6' is located on the second substrate 2, extends from the second substrate 2 toward the first substrate 1, and is spaced apart from the first substrate 1 by a second preset distance. The encapsulation layer 15 encases a top face and side walls of the display structure 3, and the barrier structure 6' is located between the encapsulation layer 5 and the sealant 4.

The material of the barrier structure 6' may be a frit. Using a frit material provides the barrier structure 6' with a good moisture barrier property. In the present embodiment, the excellent moisture barrier property of the frit is utilized without controlling a uniformity of the height of the barrier structure 6', so that a process of forming the barrier structure 6' with the frit may be applied to a large-sized OLED display panel.

A height d2 of the barrier structure 6' can be determined depending on the cell gap of the display panel. In a condition that a difference between the cell gap of the display panel and the height of the barrier structure 6' is too large, it may result in that the moisture permeation cross section may accordingly be large; In a condition that the difference between the cell gap of the display panel and the height of the barrier structure 6' is too small, it may result in that the barrier structure 6' damages the film layer on the first substrate 1 facing towards the barrier structure 6'. Therefore, in the present embodiment, the difference between the cell gap of the display panel and the height of the barrier structure 6' is 1 µm to 10 µm, on the one hand, the moisture permeation cross section is prevented from being increased, and on the other hand, the barrier structure 6' is prevented from damaging a film layer on the first substrate 1 facing towards the barrier structure 6'. In an embodiment, the encapsulation layer 5 may be a Thin Film Encapsulation (abbreviated as TFE) layer.

The encapsulation layer 5 may be a single layer structure. In this case, the material of the encapsulation layer 5 may be an inorganic material. For example, the material of the encapsulation layer 5 may include one or any combination of SiNx, SiOx, SiCx, SiOxNy, SiCxNy, or AlOx.

The encapsulating layer 5 may further include a plurality of inorganic layers and a plurality of organic layers which are alternately disposed. In this case, the material of the organic layer may be an epoxy resin material or an acrylic resin material; and the material of the inorganic layer may include one or any combination of SiNx, SiOx, SiCx, SiOxNy, SiCxNy or AlOx.

In an embodiment, the sealant 4 has a height of from 10 µm to 50 µm. The height of the sealant 4 is the cell gap of the display panel. With the above height, the risk of the foreign matters pressing and damaging the film layer can be significantly reduced.

Further, the display panel provided by the embodiments of the present disclosure further includes: a filling structure 7. The filling structure 7 is filled between the first substrate 1 and the second substrate 2, and the filling structure 7 is surrounded by the frame sealant 4, for example, the filling structure is filled in a space surrounded by the first substrate, the second substrate and the sealant. As shown in FIG. 4, in the present embodiment, the filling structure 7 covers the encapsulating layer 5 and the barrier structure 6', and is filled between the encapsulating layer 5 and the barrier structure 6', and between the barrier structure 6' and the sealant 4. In an embodiment, the material of the filling structure 7 is a filling adhesive.

In an embodiment, a moisture permeation region is formed between a top end of the barrier structure 6' and the first substrate 1 and the moisture permeation region has a cross section functioning as the moisture permeation cross section. As can be seen from FIG. 4, since the barrier structure 6' is disposed, a size of the moisture permeation cross section is reduced, and a path of moisture permeation is prolonged. In this embodiment, by adjusting the height of the barrier structure 6', the distance between the barrier structure 6' and the first substrate 1 can be adjusted, so that a purpose of reducing the size of the moisture permeation cross section can be achieved by regulation. In the meantime, since the present embodiment is aimed to reduce the moisture permeation cross section by adding the barrier structure 6', it is not necessary to reduce the cell gap of the display panel, so that the display panel can maintain a relatively large cell gap, thereby enhancing the tolerance of the display panel to the foreign matters and reducing the risk of foreign matters pressing and damaging the film layer. In practical applications, if it is necessary to increase the cell gap of the display panel, the height of the barrier structure 6' can be increased correspondingly, thereby achieving the purpose of reducing the size of the moisture permeation cross section and reducing the risk of the foreign matters pressing and damaging the film layer.

As described above, in the technical solution of the display panel provided by the above embodiments, a barrier structure is disposed between the sealant and the display structure, and the barrier structure reduces the size of the moisture permeation cross section, thereby enhancing the ability of the display panel being separated from the moisture. Moreover, it is not necessary to reduce the cell gap of the display panel, thereby enhancing the tolerance of the display panel to foreign matters, and significantly reducing the risk of the foreign matters pressing and damaging the film layer.

In the foregoing embodiment, the display panel is exemplified by an OLED display panel, and the electroluminescent layer is an organic light emitting layer. In other embodiments, the display panel may also be one of other electroluminescent display panel comprising: a PLED display panel, a QLED display panel, or the like.

An embodiment of the present invention provides a display device, which may include the display panel of any of the foregoing embodiments. The display device may be any product or component having a display function such as a display panel, an electronic paper, a mobile phone, a tablet computer, a television, a display, a notebook computer, a digital photo frame, a navigator. In the display device, a barrier structure is disposed between the sealant and the display structure, the barrier structure reduces the size of the moisture permeation cross section, thereby enhancing the ability of the display panel being separated from the moisture, without reducing the cell gap of the display panel, thereby enhancing the tolerance of the display panel to the foreign matters and reducing the risk of foreign matters pressing and damaging the film layer.

Figure 6:
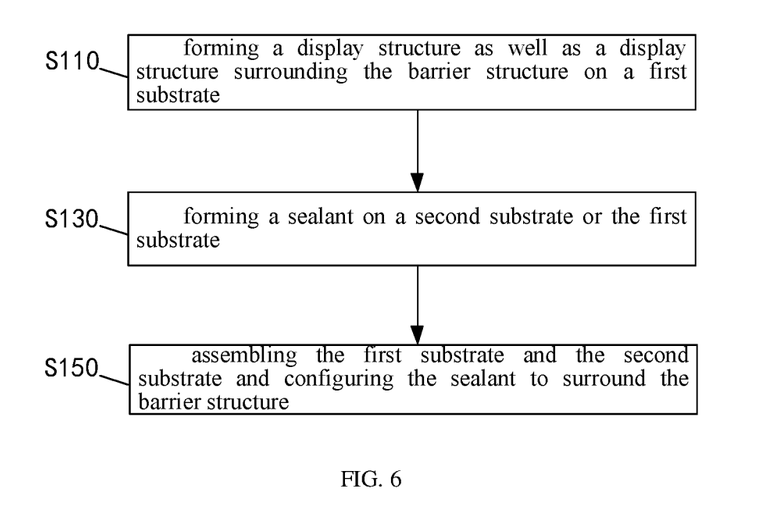
FIG. 6 is a flowchart of a method for manufacturing a display panel according to an embodiment of the present disclosure.

In an embodiment of the present disclosure, there is provided a method for manufacturing a display panel. FIG. 6 is a flowchart of a method for manufacturing a display panel according to an embodiment of the present disclosure. As shown in FIG. 6, the manufacturing method includes:

Step S110: forming a display structure as well as a display structure surrounding the barrier structure on a first substrate;

Step S130: forming a sealant on a second substrate or the first substrate; and

Step S150: assembling the first substrate and the second substrate and configuring the sealant to surround the barrier structure.

In an embodiment, as shown in FIGS. 1 and 2, the display structure may include: a first electrode layer 31, a second electrode layer 32, and a light emitting functional layer 33 between the first electrode layer 31 and the second electrode layer 32. The first electrode layer 31, the light-emitting functional layer 33, and the second electrode layer 32 are arranged to be close to the first substrate 1 sequentially. The display structure 3 also includes a thin film transistor, a color resist, a planarization layer, and a pixel defining layer.

In an embodiment, step S110 may specifically include the following steps:

Step S1101a: sequentially forming a thin film transistor and a color resistance on the first substrate.

Step S1101b: forming a barrier structure and a planarization layer on the first substrate.

Specifically, a barrier structure and a planarization layer are formed on the first substrate with one and the same material using one and the same patterning process, and the planarization layer is formed on the thin film transistor and the color resist.

Step S1101c: forming a pixel defining layer on the planarization layer, the pixel defining layer being divided into a plurality of pixel defining layers, so as to define a plurality of pixel regions.

Step S1101d: sequentially forming a second electrode layer and a light emitting functional layer in the pixel regions, the light emitting functional layer and the second electrode layer being stacked between adjacent pixel defining layers.

Step S1101e: forming a first electrode layer on a side of the light emitting functional layer away from the first substrate.

Specifically, the first electrode layer may only cover the light emitting functional layer, and may also cover the light emitting functional layer and the pixel defining layer.

In an embodiment, step S1101 specifically includes:

Step S1102a: sequentially forming a thin film transistor, a color resist, and a planarization layer on the first substrate, the planarization layer being located above the thin film transistor and the color resist.

Step S1102b, forming a barrier structure and a pixel defining layer on the first substrate, the pixel defining layer being divided into a plurality of pixel defining layers, so as to define a plurality of pixel regions.

Specifically, a barrier structure and a pixel defining layer are simultaneously formed on the first substrate with one and the same material by one and the same patterning process.

Step S1102d: sequentially forming a second electrode layer and a light emitting functional layer in the pixel regions, the light emitting functional layer and the second electrode layer being stacked between adjacent pixel defining layers.

Step S1102e: forming a first electrode layer on a side of the light emitting functional layer away from the first substrate.

Specifically, the first electrode layer may cover only the light emitting functional layer, and may also cover the light emitting functional layer and the pixel defining layer.

In an embodiment, step S101 specifically includes:

Step S1103a, sequentially forming a thin film transistor, a color resist, and a planarization layer above the first substrate, the planarization layer being located above the thin film transistor and the color resist.

Step S1103b, forming a barrier structure on the first substrate.

Step S1103c: forming a pixel defining layer on the planarization layer, the pixel defining layer being divided into a plurality of pixel defining layers, so as to define a plurality of pixel regions.

Step S1103d: sequentially forming a second electrode layer and a light emitting functional layer in the pixel regions, the light emitting functional layer and the second electrode layer being located between adjacent pixel defining layers.

Step S1103e: forming a first electrode layer on a side of the light emitting functional layer away from the first substrate.

Specifically, the first electrode layer may only cover the light emitting functional layer, and may also cover the light emitting functional layer and the pixel defining layer.

In the foregoing embodiment, the first electrode layer, the second electrode layer, and the light-emitting functional layer may be formed by an evaporation process.

In an embodiment, between step S110 and step S130, the method for manufacturing the display panel further includes:

Step S120: forming an encapsulation layer encasing the display structure and the barrier structure on the first substrate on which the display structure and the barrier structure are formed.

In step S120, the encapsulation layer 5 may include an inorganic layer, in which case the inorganic layer in the encapsulation layer may be formed by a process of a chemical vapor deposition (abbreviated as CVD), an atomic layer deposition (abbreviated as ALD) or a magnetron sputter.

The encapsulation layer 5 may also include an organic layer, in which case the organic layer in the encapsulation layer may be formed by ink-jet printing (abbreviated as IJP).

In step S130, for example, forming a sealant on the second substrate

In one embodiment, before the sealant is formed on the second substrate, the method for manufacturing the display panel may further include: cleaning and baking the second substrate. In step S130, a sealant is applied to the second substrate that has been cleaned and baked.

After the step S130, the method for manufacturing the display panel may further include: performing a filling adhesive dotting on the second substrate and on the inner side of the sealant to form a dot matrix structure; and performing a UV pre-curing to the second substrate.

In some embodiments, a sealant and/or a filling adhesive may be formed on the first substrate.

In step S150, the first substrate and the second substrate are transferred into the bonding chamber, and the first substrate and the second substrate are assembled by the bonding process in the bonding chamber; and the first substrate and the second substrate which have been assembled are further thermally cured such that the dot matrix structure forms a filling structure and the sealant are thermally cured.

After the step S150, the method for manufacturing the display panel may further include: thinning the second substrate. Specifically, the side of the second substrate away from the first substrate is thinned, such that the display panel may adapt to an industrial trend to make a product slimmer.

The method for manufacturing the display panel provided in this embodiment can be used to implement the display panel provided by the foregoing embodiments. As for the detailed description of the display panel, one may refer to the foregoing embodiments, and details are not described herein again.

As described above, in the technical solution of the display panel manufactured by the method for manufacturing the display panel provided by the above embodiments, a barrier structure is disposed between the sealant and the display structure, and the barrier structure reduces the size of the moisture permeation cross section, thereby enhancing the ability of the display panel to be separated from moisture without reducing the cell gap of the display panel, thereby enhancing the tolerance of the display panel to foreign matters, and significantly reducing the risk of foreign matters pressing and damaging the film layer.

Figure 7:
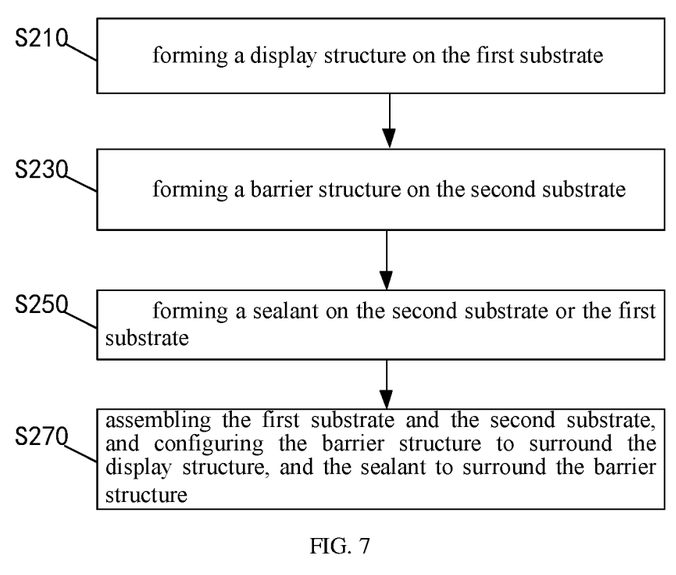
FIG. 7 is a flowchart of a method for manufacturing a display panel according to an embodiment of the present disclosure.

In an embodiment of the present disclosure, there is provided a method for manufacturing a display panel. FIG. 7 is a flowchart of a method for manufacturing a display panel according to an embodiment of the present disclosure. As shown in FIG. 7, the manufacturing method includes:

Step S210, forming a display structure on the first substrate;

Step S230: forming a barrier structure on the second substrate;

Step S250: forming a sealant on the second substrate or the first substrate; and Step S270: assembling the first substrate and the second substrate, and configuring the barrier structure to surround the display structure, and the sealant to surround the barrier structure.

In an embodiment, as shown in FIGS. 4 and 5, the display structure may include a first electrode layer 31, a second electrode layer 32, and a light-emitting functional layer 33 between the first electrode layer 31 and the second electrode layer 32. The first electrode layer 31, the light-emitting functional layer 33, and the second electrode layer 32 are disposed to be close to the first substrate 1 sequentially. The display structure 3 also includes a thin film transistor, a color resist, a planarization layer, and a pixel defining layer.

In an embodiment, step S210 may specifically include:

Step S2101, sequentially forming a thin film transistor, a color resist, and a planarization layer on the first substrate, the planarization layer being located above the thin film transistor and the color resist.

Step S2102, forming a pixel defining layer on the planarization layer, the pixel defining layer being divided into a plurality of pixel defining layers, so as to define a plurality of pixel regions.

Step S2103: sequentially forming a second electrode layer and a light emitting functional layer in the pixel regions, the light emitting functional layer and the second electrode layer being located between adjacent pixel defining layers.

Step S2104: forming a first electrode layer on a side of the light emitting functional layer away from the first substrate.

Specifically, the first electrode layer may only cover the light emitting functional layer, and may also cover the light emitting functional layer and the pixel defining layer.

In this embodiment, the first electrode layer, the second electrode layer, and the light-emitting functional layer may be formed by an evaporation process.

In an embodiment, between step S210 and step S230, the method for manufacturing the display panel further includes:

Step S220: forming an encapsulation layer encasing the display structure on the first substrate on which the display structure is formed.

In step S220, the encapsulation layer 5 may include an inorganic layer, in which case the encapsulation layer may be formed by a process of a chemical vapor deposition (abbreviated as CVD), an atomic layer deposition (abbreviated as ALD) or a magnetron sputter.

The encapsulation layer 5 may also include an organic layer, in which case the organic layer in the encapsulation layer may be formed by ink-jet printing (abbreviated as IJP).

In step S230, the barrier structure is formed on the second substrate by screen printing, ink-jet printing or a transfer process on the second substrate using a frit.

In practical applications, a barrier structure formed using a frit may also be formed on the first substrate.

In step S250, for example, a sealant is formed on the second substrate.

In one embodiment, before the sealant is formed on the second substrate, the method for manufacturing the display panel may further include: cleaning and baking the second substrate. In step S250, a sealant is applied to the second substrate that has been cleaned and baked.

After the step S250, the method for manufacturing the display panel may further include: performing a filling adhesive dotting on the second substrate and on the inner side of the sealant to form a dot matrix structure; and performing a UV pre-curing to the second substrate.

In some embodiments, a sealant and/or a filler can be formed on the first substrate.

In step S270, the first substrate and the second substrate are processed to form a display panel, and the barrier structure is located between the encapsulation layer and the sealant, and the sealant is located on the periphery of the display structure and surrounds the display structure.

Such a step includes: transferring the first substrate and the second substrate into the bonding chamber, and assembling the first substrate and the second substrate by the bonding process in the bonding chamber; thermally curing the first substrate and the second substrate which have been assembled such that the dot matrix structure forms a filling structure and the sealant are thermally cured.

After the step S270, the method for manufacturing the display panel may further include: thinning the second substrate. Specifically, the side of the second substrate away from the first substrate is thinned such that the display panel may adapt to an industrial trend to make a product slimmer.

The method for manufacturing the display panel provided in this embodiment can be used to implement the display panel provided by the foregoing embodiments. As for the detailed description of the display panel, one can refer to the foregoing embodiments, and details are not described herein again.

As described above, in the technical solution of the display panel manufactured by the manufacturing method of the display panel provided above, a barrier structure is disposed between the sealant and the display structure, and the barrier structure reduces the size of the moisture permeation cross section, thereby enhancing the ability of the display panel to be separated from moisture, without reducing the cell gap of the display panel, thereby enhancing the tolerance of the display panel to foreign matters, and significantly reducing the risk of foreign matters pressing and damaging the film layer.

It is to be understood that the above embodiments are merely exemplary embodiments employed to explain the principles of the present disclosure. However the present disclosure is not limited thereto. Various modifications and improvements can be made by those skilled in the art without departing from the spirit and scope of the disclosure, and such modifications and improvements are also considered to be within the protective scope of the disclosure.

What is claimed is:

1. A display panel comprising:
    a first substrate and a second substrate opposite to each other;
    a display structure arranged on a side of the first substrate facing the second substrate;
    a sealant surrounding the display structure;
    a barrier structure arranged in a closed-loop pattern around peripheries of the display structure and located between the display structure and the sealant, the barrier structure being disposed on the first substrate and being spaced apart from the second substrate, the barrier structure being configured to hinder moisture to penetrate into an interior of the display panel; and
    an encapsulation layer at least encasing the display structure and being spaced apart from the sealant in a direction parallel to the first substrate by a distance,
    wherein the barrier structure has a height greater than a height of the display structure;
    wherein the barrier structure comprises a first ramp and a vertical surface, the first ramp is located on a side of the barrier structure facing towards the display structure and extends from a top of the barrier structure toward a top of the display structure, and the vertical surface is located on a side of the barrier structure facing towards the display structure and perpendicular to a plane in which a surface of the first substrate is located;
    wherein the vertical surface has a height greater than the height of the display structure and is connected between the first ramp and the plane in which the surface of the first substrate is located;
    wherein the first ramp and the plane in which the surface of the first substrate is located form an acute angle which is greater than 0° and less than 45°; and wherein the barrier structure comprises a second ramp on a side of the barrier structure facing towards the sealant, and a plane in which the second ramp is located and the plane in which the surface of the first substrate is located form an acute angle which is greater than 45° and less than 90°.

2. The display panel according to claim 1, wherein the barrier structure extends from the first substrate toward the second substrate and is spaced apart from the second substrate by a first preset distance;
    and wherein the encapsulation layer further encases the barrier structure.

3. The display panel according to claim 1, wherein the display structure further comprises at least one of a planarization layer and a pixel defining layer, and the barrier structure is formed in a same layer with one of the planarization layer and the pixel defining layer.

4. The display panel according to claim 1, wherein the barrier structure is made of a material comprising a frit.

5. The display panel according to claim 1, wherein there is a distance of 10 μm to 50 μm between the first substrate and the second substrate, and there is a difference of 1 μm to 10 μm between the distance and the height of the barrier structure.

6. The display panel according to claim 1, further comprising:
    a filling structure filled in a space surrounded by the first substrate, the second substrate, and the sealant.

7. The display panel according to claim 1, wherein the display structure comprises a first electrode layer, a second electrode layer, and a light-emitting functional layer between the first electrode layer and the second electrode layer.

8. A display device comprising: the display panel according to claim 1.

* * * * *